United States Patent
Ghosh et al.

(10) Patent No.: US 10,600,624 B2
(45) Date of Patent: *Mar. 24, 2020

(54) SYSTEM AND METHOD FOR SUBSTRATE PROCESSING CHAMBERS

(71) Applicant: Applied Materials, Inc., Santa Clara, CA (US)

(72) Inventors: Kalyanjit Ghosh, Pleasanton, CA (US); Sanjeev Baluja, Campbell, CA (US); Mayur G. Kulkarni, Bangalore (IN); Shailendra Srivastava, Fremont, CA (US); Tejas Ulavi, San Jose, CA (US); Yusheng Alvin Zhou, Sunnyvale, CA (US); Amit Kumar Bansal, Milpitas, CA (US); Priyanka Dash, Menlo Park, CA (US); Zhijun Jiang, Sunnyvale, CA (US); Ganesh Balasubramanian, Fremont, CA (US); Qiang Ma, Cupertino, CA (US); Kaushik Alayavalli, Sunnyvale, CA (US); Yuxing Zhang, Santa Clara, CA (US); Daniel Hwung, Los Gatos, CA (US); Shawyon Jafari, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/230,766

(22) Filed: Dec. 21, 2018

(65) Prior Publication Data

US 2019/0122872 A1 Apr. 25, 2019

Related U.S. Application Data

(63) Continuation-in-part of application No. 15/917,079, filed on Mar. 9, 2018, now Pat. No. 10,312,076, and
(Continued)

(51) Int. Cl.
*H01J 37/32* (2006.01)
*C23C 16/52* (2006.01)
(Continued)

(52) U.S. Cl.
CPC ...... *H01J 37/32862* (2013.01); *C23C 16/401* (2013.01); *C23C 16/4412* (2013.01);
(Continued)

(58) Field of Classification Search
CPC .......... H01L 21/02274; H01L 21/02208; H01J 37/3244; H01J 37/32862; C23C 16/45502; C23C 16/4408
See application file for complete search history.

(56) References Cited

U.S. PATENT DOCUMENTS 5,558,717 A 9/1996 Zhao et al.
5,810,936 A 9/1998 Leung et al.
(Continued)

FOREIGN PATENT DOCUMENTS

KR 101004903 B1 12/2010

OTHER PUBLICATIONS

Non Final Office Action issued in U.S. Appl. No. 15/701,222, dated Oct. 31, 2019.
(Continued)

*Primary Examiner* — Karen Kusumakar
(74) *Attorney, Agent, or Firm* — Patterson + Sheridan LLP (57) ABSTRACT

Systems and methods for depositing a film in a PECVD chamber while reducing residue buildup in the chamber. In some embodiments disclosed herein, a processing chamber includes a chamber body, a substrate support, a showerhead,
(Continued)

and one or more heaters configured to heat the showerhead. In some embodiments, the processing chamber includes a controller.

22 Claims, 6 Drawing Sheets

Related U.S. Application Data a continuation-in-part of application No. 15/701,222, filed on Sep. 11, 2017.

(60) Provisional application No. 62/736,882, filed on Sep. 26, 2018, provisional application No. 62/469,914, filed on Mar. 10, 2017.

(51) Int. Cl.
*C23C 16/455* (2006.01)
*C23C 16/40* (2006.01)
*C23C 16/44* (2006.01)
*C23C 16/50* (2006.01)
*C23C 16/458* (2006.01)

(52) U.S. Cl.
CPC ...... *C23C 16/4557* (2013.01); *C23C 16/4585* (2013.01); *C23C 16/45565* (2013.01); *C23C 16/50* (2013.01); *C23C 16/52* (2013.01); *H01J 37/3244* (2013.01); *H01J 37/32449* (2013.01); *H01J 37/32513* (2013.01); *H01J 37/32522* (2013.01); *H01J 37/32715* (2013.01); *H01J 37/32834* (2013.01); *H01J 2237/3321* (2013.01)

(56) References Cited

U.S. PATENT DOCUMENTS

| | | | |
|---|---|---|---|
| 5,846,332 A | 12/1998 | Zhao et al. | |
| 5,885,356 A | 3/1999 | Zhao et al. | |
| 5,895,530 A | 4/1999 | Shrotriya et al. | |
| 5,919,332 A | 7/1999 | Koshiishi et al. | |
| 5,945,351 A | 8/1999 | Mathuni | |
| 6,026,762 A | 2/2000 | Kao et al. | |
| 6,159,299 A | 12/2000 | Koai et al. | |
| 6,274,058 B1 | 8/2001 | Rajagopalan et al. | |
| 6,406,589 B1 | 6/2002 | Yanagisawa | |
| 6,582,522 B2 | 6/2003 | Luo et al. | |
| 6,645,884 B1 | 11/2003 | Yang et al. | |
| 6,663,714 B2 | 12/2003 | Mizuno et al. | |
| 7,816,272 B2 | 10/2010 | Tsutae | |
| 8,252,410 B2 | 8/2012 | Rasheed | |
| 8,366,953 B2 | 2/2013 | Kohno et al. | |
| 9,528,183 B2 | 12/2016 | Wu et al. | |
| 2006/0086259 A1* | 4/2006 | Okajo | H01J 7/3244 99/342 |
| 2008/0072821 A1 | 3/2008 | Dalton et al. | |
| 2008/0178801 A1 | 7/2008 | Pavloff et al. | |
| 2009/0179085 A1 | 7/2009 | Carducci et al. | |
| 2011/0268892 A1 | 11/2011 | Oda et al. | |
| 2012/0009765 A1 | 1/2012 | Olgado | |
| 2012/0052216 A1 | 3/2012 | Hanawa et al. | |
| 2012/0237693 A1 | 9/2012 | Jackson et al. | |
| 2014/0262026 A1 | 9/2014 | Forster et al. | |
| 2014/0326276 A1 | 11/2014 | Wu et al. | |
| 2015/0099065 A1 | 4/2015 | Canizares et al. | |
| 2015/0255259 A1 | 9/2015 | Li et al. | |
| 2016/0312359 A1 | 10/2016 | Dubois et al. | |
| 2017/0178758 A1 | 6/2017 | Ha et al. | |
| 2017/0275753 A1 | 9/2017 | Baluja et al. | |

OTHER PUBLICATIONS

U.S. Appl. No. 16/583,003, filed Sep. 25, 2019.
International Search Report and Written Opinion issued in International Patent Application No. PCT/US2019/047189, dated Dec. 6, 2019.

* cited by examiner

FIG. 6

SYSTEM AND METHOD FOR SUBSTRATE PROCESSING CHAMBERS

CROSS-REFERENCE TO RELATED APPLICATIONS

This application is a continuation-in-part of U.S. patent application Ser. No. 15/917,079, filed on Mar. 9, 2018, which claims priority to U.S. Provisional Patent Application Ser. No. 62/469,914, filed Mar. 10, 2017. This application is also a continuation-in-part of U.S. patent application Ser. No. 15/701,222, filed on Sep. 11, 2017. This application also claims benefit of U.S. Provisional Patent Application Ser. No. 62/736,882, filed on Sep. 26, 2018. The aforementioned applications are herein each incorporated by reference in their entirety.

BACKGROUND

Field

Embodiments described herein generally relate to the field of semiconductor device manufacturing, and more particularly, to chemical vapor deposition (CVD) chambers.

Description of the Related Art

Deposition processes, such as chemical vapor deposition (CVD) and plasma enhanced CVD (PECVD) processes, are commonly used in semiconductor device manufacturing to deposit material layers on a substrate surface by reacting one or more gaseous precursors, or activated species thereof, with or on the substrate surface. Gaseous precursors may include one or both of gas-phase precursors and vapor-phase precursors.

Unfortunately, gaseous precursors, and the reaction byproducts thereof, also undesirably deposit material (such as residue material) on surfaces of the walls and other components disposed in the processing volume of the substrate processing chamber. Commonly, with every substrate processed the thickness of the residue material deposits increases. Thick residue material deposits can eventually flake from the processing chamber surfaces leading to undesirable particulate contamination in the processing volume, which negatively affects the quality of the material layer deposited on the substrate. The flaking material can lead to defects on the substrate. Therefore, CVD and PECVD processing chambers are sometimes cleaned to remove residue material therefrom. However, cleaning can result in lower substrate throughput, increased chamber downtime, lost production capacity, and cleaning contaminants in the processing chamber.

Accordingly, there is a need in the art for a system and method to reduce or eliminate undesirable deposition of unreacted precursors and the reaction byproducts thereof on processing volume surfaces and other components of the processing chamber. There is also a need for an improved system and method of cleaning the process chamber.

SUMMARY

Embodiments disclosed herein generally provide systems and methods relating to depositing a material layer on a substrate disposed on a substrate support in a CVD chamber while reducing or minimizing deposition of residue on processing volume surfaces and other components in the processing chamber. Embodiments disclosed herein also generally provide systems and methods relating to cleaning the process chamber.

In one embodiment, a processing chamber system includes a chamber body having a chamber base, one or more sidewalls, and a chamber lid defining a processing volume, wherein the chamber lid comprises a showerhead; a substrate support disposed in the processing volume, the substrate support having a first surface, a second surface opposite the first surface, and a third surface connecting the first surface and the second surface around a circumference of the substrate support; wherein the processing volume comprises a first volume defined by the first surface of the substrate support and a surface of the showerhead that faces the processing volume, and a second volume defined by the second surface of the substrate support and a surface of the chamber base that faces the processing volume; a purge gas source that is configured to introduce a purge gas into the second volume through one or more openings; a precursor source that is configured to introduce a precursor gas into the first volume through the showerhead; a combined gas exhaust volume that is configured to evacuate the purge gas and the precursor gas, wherein the precursor gas is evacuated from the first volume to the combined gas exhaust volume through a first gas inlet and the purge gas is evacuated from the second volume to the combined gas exhaust volume through a second gas inlet; and one or more heaters disposed in the showerhead that are configured to heat the showerhead.

In one embodiment, a processing chamber system includes a chamber body having a chamber base, one or more sidewalls, and a chamber lid defining a processing volume, wherein the chamber lid comprises a showerhead; a substrate support disposed in the processing volume, the substrate support having a first surface, a second surface opposite the first surface, and a third surface connecting the first surface and the second surface around a circumference of the substrate support; a first liner disposed in a circumferential channel in the chamber body, wherein the first liner is located between a plane of the second surface and the chamber base; a second liner disposed radially inwardly of the first liner, wherein the first liner and the second liner define an exhaust channel; a third liner disposed radially inwardly of the one or more sidewalls between the first liner and the chamber lid, wherein the second liner, the third liner, and the third surface of the substrate support define a combined gas exhaust volume when the substrate support is in a raised position, wherein a first inlet to the combined gas exhaust volume is disposed between the substrate support and the third liner and a second inlet to the combined gas exhaust volume is disposed between the substrate support and the second liner when the substrate support is in the raised position, and wherein an opening into the combined gas exhaust volume from the first inlet is below the plane of the first surface and an opening into the combined gas exhaust volume form the second inlet is above the plane of the second surface when the substrate support is in the raised position; and one or more heaters disposed in the showerhead that are configured to heat the showerhead.

In one embodiment, a processing chamber system, includes a chamber body having an interior volume, wherein the chamber body has an interior chamber surface; a substrate support disposed in the interior volume; a showerhead having one or more heaters that are configured to heat the showerhead; a process kit disposed in the interior volume, the process kit comprising a top edge member disposed outwardly from the substrate support, a pumping liner disposed outwardly from the substrate support in the chamber body, wherein the pumping liner surrounds a purge volume, and an outer flow path disposed between the pumping liner and the interior chamber surface; a purge gas opening in the chamber body in fluid communication with the purge volume; an exhaust outlet in the chamber body, wherein the exhaust outlet is in fluid communication with the outer flow path; and a cover substrate disposed above the substrate support, wherein a purge gap is disposed between the top edge member and the cover substrate.

BRIEF DESCRIPTION OF THE DRAWINGS

So that the manner in which the above recited features of the present disclosure can be understood in detail, a more particular description of the present disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein provide systems and methods for reducing or preventing residue from building on surfaces and components of substrate processing chambers. Embodiments disclosed herein also provide systems and methods for cleaning substrate processing chambers to remove residue from surfaces and components of substrate processing chambers.

In some embodiments, a system and method related thereto prevent unreacted gaseous precursors and gaseous precursor reaction byproducts (herein collectively called processing gas) from flowing into a portion of a processing volume disposed between a substrate support and a chamber base. In some embodiments, this may be achieved during chemical vapor deposition (CVD) or plasma enhanced chemical vapor deposition (PECVD) processes without negatively impacting material layer deposition rates, material layer thickness uniformity, and material layer film quality. Embodiments herein further provide for uniform removal of the processing gas from a portion of the processing volume disposed between the substrate support and a chamber lid, and reduced residence time of the processing gas therein. Uniform removal of processing gas from such a portion of the processing volume affects the material layer film quality and material layer thickness uniformity across the surface of the substrate. Sometimes, reduced residence time of processing gas in such a portion of the processing volume desirably increases the deposition rate of the material layer.

Typically, during CVD and PECVD processes, processing gases are removed from a portion of a processing volume, herein a first volume, located between a substrate support and a gas showerhead, through an exhaust channel circumferentially disposed in a chamber wall and coplanar with a surface of a substrate disposed on a substrate support. The exhaust channel draws processing gases radially outward from a center region of the first volume, where the center region is above the center of the substrate. The processing gas is then removed from the exhaust channel through an exhaust port circumferentially, or substantially circumferentially, formed through the chamber wall and fluidly coupled to a vacuum source, such as one or more dedicated vacuum pumps. The exhaust channel is located around the first volume and above the plane of the substrate support.

Typically, at least some of the processing gases not captured by the exhaust system described above undesirably flow into a portion of the processing volume disposed between the substrate support and the chamber base, herein a second volume, where they undesirably deposit residue material on the chamber walls, the chamber base, and other chamber components. In particular, unreacted tetraethoxysilane (TEOS) deposits residue material more readily on chamber surfaces that are not heated (or heated to a relatively low temperature) than on surfaces that are heated (such as the substrate support and the faceplate of a showerhead). One method of preventing processing gases from entering the second volume is to pressurize the second volume relative to the first volume by flowing a purge gas thereinto. However, in a conventional processing chamber configuration, purge gas cannot be used to pressurize the second volume without being drawn into the exhaust channel described above and resultantly negatively affect the uniform removal of processing gases from the first volume. Additionally, in a PECVD chamber with in-situ plasma generation, purge gas introduced into the first volume, or an exhaust channel adjacent thereto, may form an undesirable secondary plasma and, or, cause undesirable arcing between the substrate support and the chamber walls.

Therefore, in embodiments disclosed herein, a combined gas exhaust volume circumferentially disposed about the substrate support, at a location below the first volume and above the second volume, draws processing gases from the first volume down over an edge of a first surface of the substrate support and simultaneously draws purge gas from the second volume upward and over an edge of a second surface of the substrate support. The combined processing gases and purge gas are then evacuated from the combined exhaust volume into an exhaust pumping channel and out of the exhaust pumping channel through an exhaust port fluidly coupled to a vacuum source. Locating the combined gas exhaust volume below the first volume and above the second volume prevents purge gases from entering the first volume while simultaneously preventing processing gases from entering the second volume and depositing on the surfaces thereof. Therefore, benefits of embodiments herein include reduced deposition of residue material on the chamber walls and chamber components in the second volume, fewer cleaning cycles, more time between scheduled maintenance, and, therefore, increased production capacity.

Figure 1A:
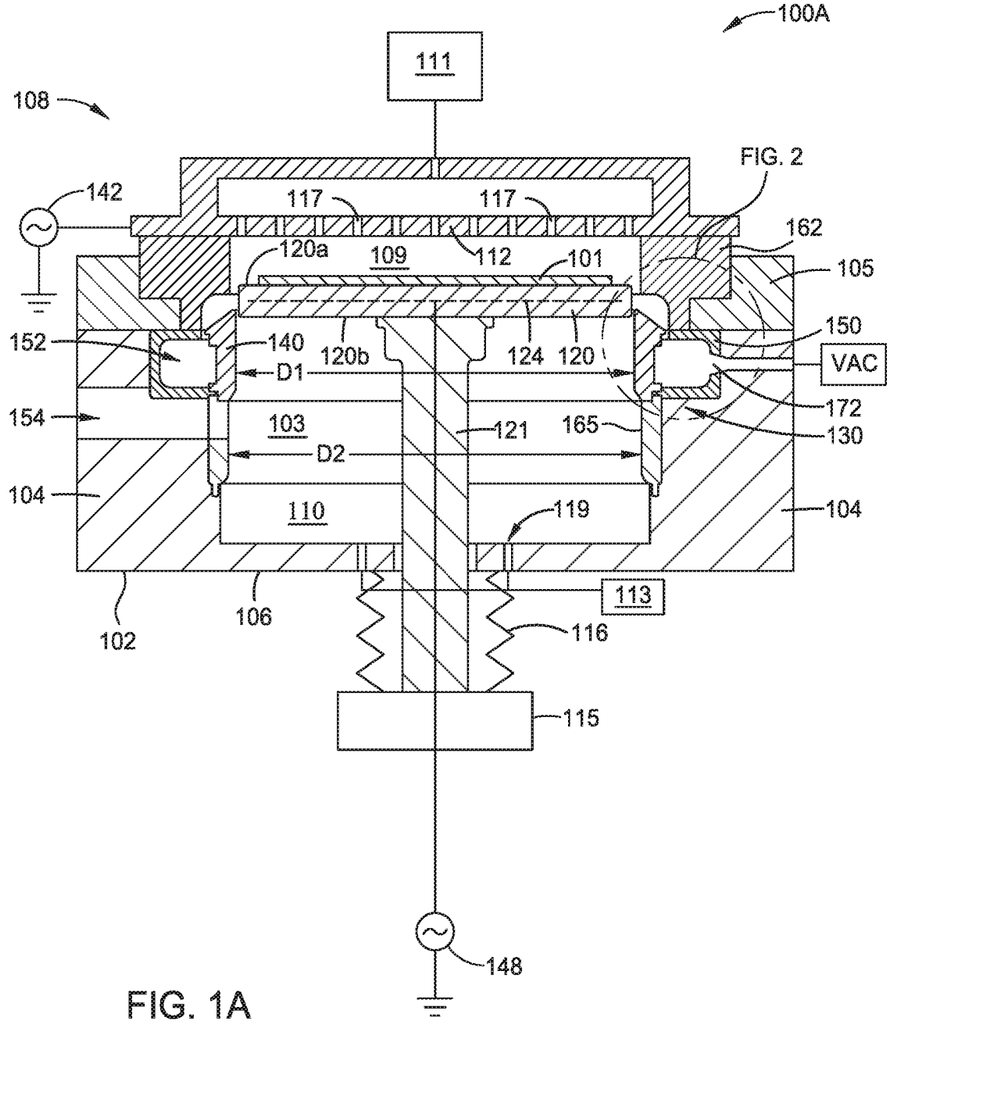
FIG. 1A is a schematic sectional view of a processing chamber system, according to one embodiment.

FIG. 1A is a schematic sectional view of an exemplary processing chamber system, according to one embodiment.

The processing chamber 100 includes a chamber body 102 having one or more sidewalls 104, a chamber base 106, and a chamber lid assembly 108 which together define a processing volume 103. The processing chamber 100 also includes a substrate support 120 disposed in the processing volume 103. The processing volume 103 includes a first volume 109 and a second volume 110. The first volume 109 is defined by the inner surface of the sidewalls 104, the inner surface of the chamber lid assembly 108 and the chamber lid assembly facing surface(s) of the substrate support 120, such as the first surface 120a, when the substrate support 120 is in a raised, substrate processing, position (as shown). The second volume 110 is defined by the inner surface of the one or more sidewalls 104, the chamber base facing surface(s) of the substrate support 120, such as the second surface 120b, and the inner surface of the chamber base 106. Typically, the first volume 109 is less than about 10% of the processing volume 103, such as less than about 5% thereof.

The chamber lid assembly 108 is electrically isolated from the one or more sidewalls 104 by an $Al_2O_3$ isolator ring, herein the T-liner 162, disposed therebetween. A showerhead 112, disposed in the chamber lid assembly 108 and coupled thereto, has a plurality of openings 117 disposed therethrough, which uniformly distribute one or more gaseous precursors from a precursor source 111 into the first volume 109. The showerhead 112 is formed of an electrically conductive material, for example aluminum, and is coupled to a first power supply 142, such as an RF power supply, which supplies power to ignite and maintain a plasma of the gaseous precursors through capacitive coupling therewith. In some embodiments, at least one of DC power or pulsed DC power, of positive or negative polarity, and of pulsed RF power is also coupled to the showerhead 112.

The substrate support 120 includes a first surface 120a facing the chamber lid assembly 108 for receiving a substrate 101, a second surface 120b opposite the first surface 120a and facing the chamber base 106, and a circumferential third surface 120c (shown in FIG. 2) connecting the first surface 120a and the second surface 120b. In some embodiments, the third surface 120c faces the one or more sidewalls 104 and is orthogonal to the first and second surfaces 120a,b. The first surface 120a has a first plane and the second surface 120b has a second plane substantially in parallel with the first plane. Herein, substantially parallel at least means that the first plane and the second plane will not intersect within the processing volume 103 of the processing chamber 100.

Typically, during processing to form a thin film thereon, a substrate 101 is secured to the first surface 120a of the substrate support 120 by an electrostatic chucking (ESC) force. The chucking force is a function of a potential between a voltage provided to a chucking electrode 124 embedded in a dielectric material of the substrate support 120 and the substrate 101 disposed thereon. Typically, the chucking electrode 124 is coupled to a second power supply 148, such as a DC power supply. In some embodiments, the substrate support 120 includes one or more heaters (not shown), such as one or more resistive heating elements, embedded therein. In some embodiments, the substrate support 120 includes one or more cooling channels (not shown) disposed therein that are fluidly coupled to, and in fluid communication with, a coolant source (not shown) through one or more coolant lines (not shown). Typically, the coolant source is a refrigerant source or water source having a relatively high electrical resistance. In some embodiments, the substrate support 120 includes both of one or more heaters and one or more cooling channels to enable fine control of the temperature of the substrate support 120 and the substrate 101 disposed thereon.

The substrate support 120 is coupled to a support shaft 121 which is coupled to a lift actuator 115 which raises and lowers the support shaft 121, and the substrate support 120 coupled thereto, to facilitate processing of the substrate 101 and transfer thereof to and from the processing chamber 100. A bellows 116, circumscribing the support shaft 121, is coupled to the chamber base 106 and to the lift actuator 115 to provide a flexible seal therebetween and to maintain the vacuum integrity of the processing volume 103. The lift actuator 115 is configured to move the substrate support 120 between a lowered position (not shown), to facilitate transfer of the substrate 101 to and from the processing volume 103 and a raised position, as shown, for processing of the substrate 101.

The substrate 101 is loaded into, and removed from, the processing volume 103 through an opening 154 in one of the one or more sidewalls 104, which is conventionally sealed with a door or a valve (not shown) during substrate processing. Typically, the processing chamber 100 further includes a lift pin system (not shown) used to lift the substrate 101 from the substrate support 120 when the substrate support 120 is in a lowered position (not shown) which enables access to the substrate 101 by a robot handler (not shown).

A purge gas is delivered to the second volume 110 during substrate processing or chamber cleaning operations. The purge gas flows into the second volume 110 through one or more openings 119 disposed through the chamber base 106 around the support shaft 121 or at one or more locations radially outward therefrom. In some embodiments, the one or more openings 119 have a symmetrical cross sectional shape, such as a circular cross sectional shape. In some embodiments, the one or more opening 119 have an asymmetrical cross sectional shape. The purge gas is provided by a purge gas source 113 in fluid communication with the one or more openings 119.

An exhaust liner assembly 130, disposed in the processing volume 103, is configured to reduce undesirable residue material deposition on the inner walls of the chamber body 102 and on surfaces of chamber components disposed in the second volume 110, by facilitating the uniform removal of processing gases from the first volume 109, and to prevent purge gas from flowing into the first volume 109 from the second volume 110. The exhaust liner assembly 130 includes a circumferential, C-channel shaped in section, liner 150, hereafter C-channel liner 150, a circumferential, T-shaped in section, liner 162, hereafter T-liner 162, and a circumferential top liner 140 which define flow pathways of the processing gases and the purge gas during substrate processing, as further described in FIGS. 2 and 3. In some embodiments, the processing chamber 100 further includes a circumferential bottom liner 165, disposed between the top liner 140 and the chamber base 106, which lines at least a portion of the surface of the one or more sidewalls 104 facing the processing volume 103. An inner diameter $D_1$ of the top liner 140 measured at an inner wall 405 thereof (shown in FIG. 4) is less than an inner diameter $D_2$ of the bottom liner 165.

Herein, the respective liners 140, 150, 162, and 165 are made from a ceramic material, such as aluminum oxide, or other material which is suitably resistant to heat and corrosion from halogen containing cleaning plasmas, such as $NF_3$ based plasma. Typically, the liners 140, 150, 162, and 165 are periodically removed from the processing chamber 100 for scheduled cleaning or replacement.

Figure 1B:
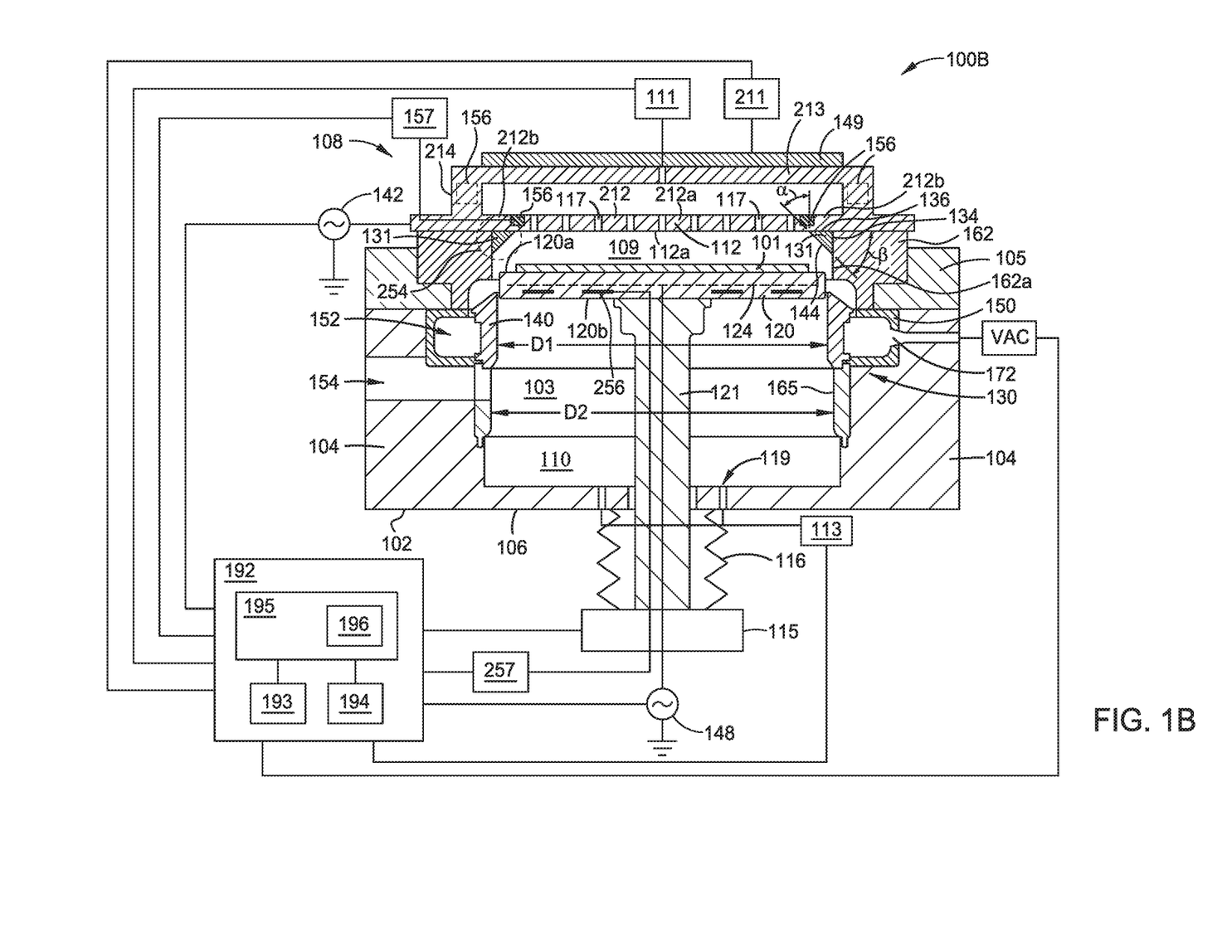
FIG. 1B is a schematic sectional view of a processing chamber system, according to one embodiment.

FIG. 1B illustrates an embodiment of a process chamber 100B that is similar to the process chamber 100A illustrated in FIG. 1A, but includes one or more heaters 156 disposed in the showerhead 112. The process chamber 100B additionally includes a ring 131. The showerhead 112 includes a faceplate 212, a backing plate 213, and a vertical portion 214 connecting the faceplate 212 and the backing plate 213. The faceplate 212, backing plate 213, and the vertical portion 214 may be coupled to each other, connected to each other, or integrated to form a single body. The ring 131 is disposed on a surface 112a of the faceplate 212. The surface 112a faces the first volume 109 of the processing volume 103. The faceplate 212 includes an inner portion 212a that includes the plurality of openings 117, and an outer portion 212b disposed outside of the plurality of openings 117.

The heaters 156 (some of which are optional and shown in phantom) are embedded in the showerhead 112. The heaters 112 are coupled to one or more power sources 157 that are configured to apply power of about 500 Watts to about 1100 Watts to the one or more heaters 156. The heaters 156 provide heat to the showerhead 112 during substrate processing. The showerhead 112 can be formed from a metal such as aluminum or stainless steel, and can be coated with an oxide such as aluminum oxide ($Al_2O_3$). In some embodiments, the heaters 156 heat the showerhead 112 to a temperature within a range of about 270 degrees Celsius to about 350 degrees Celsius during substrate processing. In some embodiments, the showerhead 112 is heated to a first temperature within a range of about 270 degrees Celsius to about 350 degrees Celsius during a first operation, and then maintained at a second temperature that is equal to, above, or below the first temperature during a second operation. The first operation and second operation can be performed on the same substrate, or can be performed on different substrates. In some embodiments, the one or more heaters 156 are disposed throughout the showerhead 112 and controlled, either individually or in groups, to create varying zones of temperatures throughout the showerhead 112. In some embodiments, heaters 156 are disposed in one or both of the faceplate 212 of the showerhead 112 and the vertical portion 214 of the showerhead 112. In some embodiments, the showerhead 112 is heated to a first temperature within a range of about 270 degrees Celsius to about 350 degrees Celsius while the substrate support 120 is heated to a second temperature within a range of about 250 degrees Celsius to about 350 degrees Celsius. The substrate support 120 is heated by one or more heaters 256 that are powered by one or more power sources 257. In some embodiments, the showerhead 112 is heated to a first temperature having a value that is within +/−10% of a value of a second temperature of the substrate support 120.

The temperature of the showerhead 112 can be established prior to positioning the substrate 101 in the processing chamber 100. The temperature of the showerhead 112 can be held or modified within a predetermined temperature range during the formation of one or more films in the processing chamber 100. The elevated temperature of the showerhead 112 promotes gas flow into the processing chamber 100 in part by reducing the temperature differential between the showerhead 112 and the substrate support 120 upon which the substrate 101 is positioned. The reduced temperature differential causes less diffusion of species from higher-temperature areas to lower-temperature areas, and/or less mass diffusion. The improved gas flow can lessen the occurrence and severity of buildup of residue in the processing chamber 100 since flowing (moving) gas is less likely to cause build up, in contrast to gas that is stationary or trapped outside of a gas flow. The elevated temperature of the showerhead 112 also reduces the occurrence and/or the severity of buildup on the showerhead 112. Additionally or alternatively, the elevated temperature of the showerhead 112 causes buildup that does occur to be less brittle and therefore less likely to loosen and cause defects. In some embodiments, the temperature of the showerhead 112 is controlled by applying power to one or more heaters 156. In some embodiments, the showerhead 112 has the plurality of heaters 156 disposed therein and configured to create a temperature gradient and/or temperature zones across the showerhead 112. The plurality of heaters 156 can be used to raise, lower, or maintain the temperature of the showerhead 112 to reduce deposition onto, or flaking of material from, the showerhead 112.

The ring 131 is disposed adjacent to and/or in contact with the surface 112a of the faceplate 212 of the showerhead 112. The ring 131 is also disposed adjacent to and/or in contact with an inner wall 162a of the T-liner 162. The ring 131 may be a separate component from the T-liner 162, or the ring 131 can be integrated with the T-liner 162 to form a single body. The ring 131 may be a separate component from the showerhead 112, or the ring 131 can be integrated with the showerhead 112 to form a single body. The ring 131 can be fabricated from $Al_2O_3$. In some embodiments, the ring 131 is coupled to the faceplate 212 of the showerhead 112. In some embodiments, the ring 131 is disposed adjacent to the outer portion 212b of the faceplate 212. In some embodiments, the ring 131 is disposed radially outwardly from the plurality of openings 117. In some embodiments, the ring 131 is disposed such that it surrounds the plurality of openings 117.

In some embodiments, one or more heaters 156 may be disposed at a radial distance defined by an inner radius of the ring 131 and an outer radius of the ring 131.

In some embodiments, which can be combined with other embodiments, the one or more heaters 156 are disposed radially outwardly from the plurality of openings 117. The ring 131 is defined in part by an outer surface 134, an upper surface 136, and an inner surface 144. The outer surface 134 of the ring 131 is positioned in proximity to the T-liner 162 such that the T-liner 162 is in contact with (in direct contact or with an adhesive disposed in therebetween) the outer surface 134. The upper surface 136 is coupled to the surface 112a of the faceplate 212 of the showerhead 112. In some embodiments, the ring 131 is disposed outside of the plurality of openings 117. The inner surface 144 can be at an angle α relative to the outer surface 134. The angle α can be from 0-90 degrees, such as from 1-70 degrees, from 15-45 degrees, or from 30-60 degrees. The inner surface 144 can be at an angle β from 0-90 degrees, such as from 1-70 degrees, from 15-45 degrees, or from 30-60 degrees.

The ring 131 influences the flow paths of precursor gases and carrier gases to guide them towards the T-liner 162 and/or the substrate 101. For example, in some embodiments the ring 131 is an angled ring, and the angled inner surface 144 of the ring 131 prevents flowing gases from becoming trapped in areas of the processing volume 103 that are outside of the plurality of openings 117. These areas may be referred to as dead zones 254. In some embodiments, the dead zones 254 are positioned radially outwardly of the substrate support 120. The inner surface 144 of the ring 131 is shown as flat in FIG. 1B. The present disclosure contemplates that the inner surface 144 could be a concave surface or another shape that directs gas flow towards the T-liner 162 and/or the substrate 101. In some embodiments, the inner surface 144 of the ring 131 is angled radially outwards from the faceplate 212 of the showerhead 112 to the T-liner 162. In some embodiments, the ring 131 blocks flowing gases from reaching dead zones 254 defined by the corners of the processing volume 103 that are radially outside of the plurality of openings 117. By preventing some gases from becoming trapped in such dead zones 254, or by directing some flowing gases towards the T-liner 162 and/or the substrate 101 during processing, material buildup can be reduced or eliminated near such dead zones 254. By reducing material buildup, substrate defects can be reduced due to the lesser probability of buildup falling on a substrate 101 and causing a defect.

In FIG. 1B, the outer surface 134, the upper surface 136, and the inner surface 144 are illustrated as either flat and/or smooth surfaces. In some embodiments, there can be bevels, cooling channels, mating features, or other features included in the surfaces of the ring 131. While the ring 131 is shown with a circular shape having a central opening, it is contemplated that the ring 131 may take the form of other shapes having a central opening, including an oval, square, or rectangle.

The chamber lid assembly 108 may include an optional chiller plate 149. In some embodiments, when the chiller plate 149 is coupled to the showerhead 112, the chiller plate 149 facilitates control over a temperature or a temperature gradient across the showerhead 112 during, for example, the deposition of one or more films on the substrate 101. In some embodiments, the chiller plate 149 includes a plurality of channels (not shown) formed in the chiller plate 149. The plurality of channels allow a temperature control fluid provided by a temperature control fluid supply (chiller) 211 to flow through the chiller plate 149 to facilitate the control over the temperature of the first member 128.

The processing chamber 100 includes a controller 192 that is configured to control one or more components of the processing chamber 100. The controller 192 comprises a central processing unit or CPU 193, support circuitry 194, and memory 195 containing associated control software 196. The controller 192 may be one of any form of a general purpose computer processor that can be used in an industrial setting for controlling various chambers and sub-processors. The CPU 193 may use any suitable memory 195, such as random access memory, read only memory, floppy disk drive, compact disc drive, hard disk, or any other form of digital storage, local or remote. Various support circuits may be coupled to the CPU 193 for supporting the process chamber 100. The controller 192 may be coupled to another controller that is located adjacent individual chamber components. Bi-directional communications between the controller 192 and various other components of the process chamber 100 are handled through numerous signal cables collectively referred to as signal buses, some of which are shown in FIG. 1B.

The controller 192 illustrated in FIG. 1B is configured to control at least the vacuum source VAC, precursor source 111, purge gas source 113, lift actuator 115, first power supply 142, second power supply 148, one or more power sources 157, one or more power sources 257, and temperature control fluid supply 211.

Figure 2:
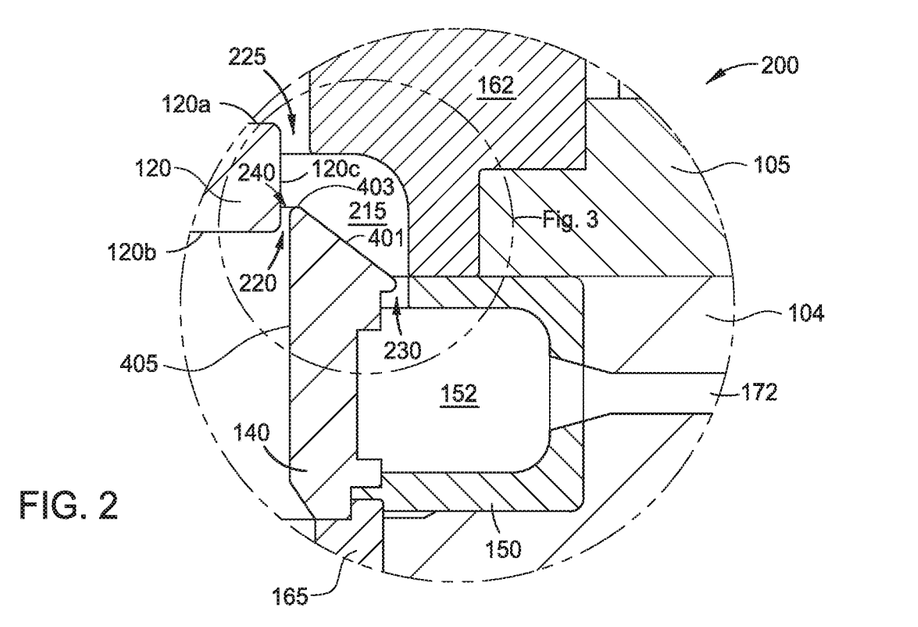
FIG. 2 is an enlarged view of a portion of FIG. 1A.
Figure 3:
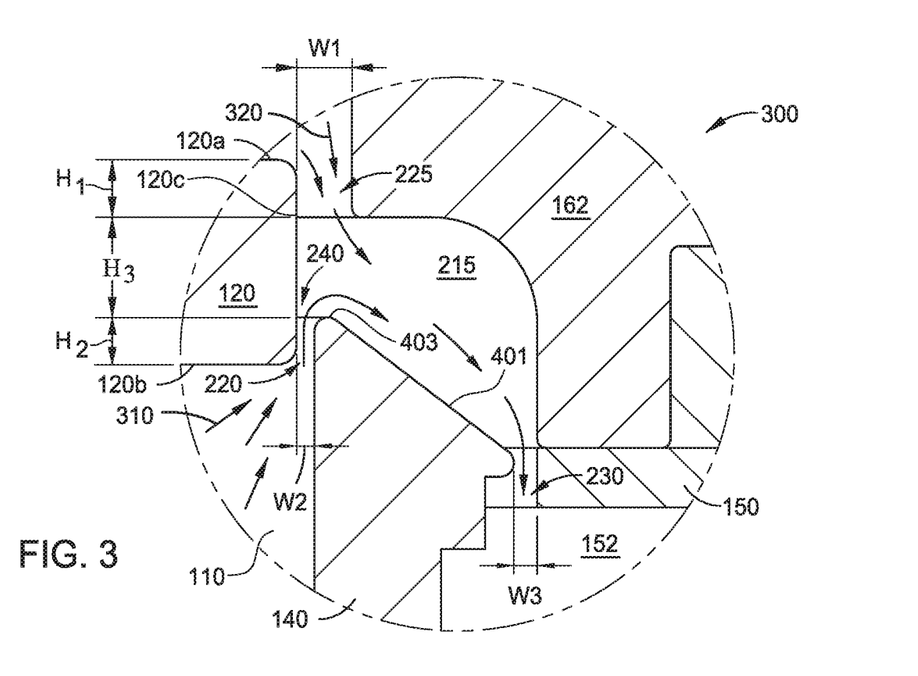
FIG. 3 is an enlarged view of a portion of FIG. 2.

FIG. 2 is an enlarged view of a portion of FIG. 1. FIG. 3 is an enlarged view of a portion of FIG. 2 illustrating flow pathways of the processing gas 320 and the purge gas 310 during substrate processing in the process chambers 100A and 100B. In the embodiment shown, the C-channel liner 150 is disposed in a circumferential channel located below the substrate support 120 and radially outwardly therefrom. The circumferential channel is defined by the T-liner 162, one or more sidewalls 104, and a top plate 105 secured to the one or more sidewalls 104. The top plate 105 is located adjacent to the T-liner 162 and disposed radially outwardly therefrom. The circumferential channel and the C-channel liner 150 disposed therein, are located below the second plane of the second surface 120b of the substrate support 120 and the chamber base 106 when the substrate support 120 is in a raised, substrate processing, position. A portion of the T-liner 162 extends radially inwardly of the one or more sidewalls 104, at a location between the C-channel liner 150 and the chamber lid assembly 108 an along the inner surface of the chamber lid assembly 108, and terminates radially outwardly from, but proximate, to the substrate support 120 when the substrate support 120 is in the raised, substrate processing position. The top liner 140 is disposed radially inwardly of the C-channel liner 150 and the T-liner 162. Surfaces of the top liner 140 and the C-channel liner 150 define an exhaust channel 152 which is in fluid communication with the vacuum source, such as one or more dedicated vacuum pumps, through an exhaust port 172 formed through the C-channel liner 150 and further through one of the one or more sidewalls 104.

The third surface 120c of the substrate support 120 (in the raised position), the top liner 140, and the T-liner 162 define a combined gas exhaust volume 215 having a first inlet 225, a second inlet 220, and having a height $H_3$ between the openings of the first inlet 225 the second inlet 220 thereinto. The first inlet 225 is located between the inward terminal wall of the T-liner 162 and the third surface 120c of the substrate support 120. The second inlet 220 is located between an inner wall 405 of the top liner 140 and the third surface 120c of the substrate support 120. The first inlet 225 has a width $W_1$ between about 0.5 mm and about 10 mm across the gap between the inward terminal wall of the T-liner 162 and the third surface 120c of the substrate support 120. In some embodiments, the width $W_1$ is between about 2 mm and about 5 mm. The second inlet 220 has a width $W_2$ between about 0.5 mm and about 5 mm across the gap between the inner wall 405 of the top liner 140 and the third surface 120c the substrate support 120. In some embodiments, the width $W_2$ is between about 1 mm and about 3 mm. In some embodiments, the width $W_2$ is about 2 mm. Typically, the width $W_2$ of the second inlet 220 is determined by the inner diameter $D_1$ of the top liner 140 and can be changed by using a different top liner 140 having a different inner diameter D1.

An opening of the first inlet 225 into the combined gas exhaust volume 215 is located below a plane of the first surface 120a by a height $H_1$ so that processing gas 320 from the first volume 109 flows radially outward from a region above the center of the substrate 101 disposed therein and around the circumferential edge of the first surface 120a into the combined gas exhaust volume 215. The opening of the second inlet 220 into the combined gas exhaust volume 215 is located above a plane of the second surface 120b by a height $H_2$ so that purge gas 310 is drawn into combined gas exhaust volume 215 and blocks processing gas 320 from flowing into the second volume 110.

The height $H_3$ of the combined gas exhaust volume 215 between the openings of the first inlet 225 and second inlet 220 thereinto is at least the sum of the width $W_1$ of the first inlet and the width $W_2$ of the second inlet 220 so that the flow of the processing gas 320 and the flow of the purge gas 310 into the combined gas exhaust volume 215 from the respective first and second inlets 225 and 220 are less restricted.

An outlet 230 from the combined gas exhaust volume 215 into the exhaust channel 152 is defined by a circumferential wall at the inner terminus of an arm of the C-channel liner 150 and a sidewall facing surface of the top liner 140. The outlet 230 has a width $W_3$ of between about 0.5 mm and about 10 mm, for example between about 2 mm and about 7 mm.

During substrate processing, the processing gas 320 in the first volume 109 is drawn radially outward from the region above the center of a substrate disposed therein and down over the circumferential edge of the first surface 120a of the substrate support 120 into the combined gas exhaust volume 215 through the first inlet 225. Simultaneously, purge gas 310 in the second volume 110 is drawn into the combined gas exhaust volume 215 through the second inlet 220. Both the processing gas 320 and purge gas 310 are then drawn from the combined gas exhaust volume 215 through the outlet 230 and into the exhaust channel 152 where they are evacuated from the processing chamber 100 through the exhaust port 172. An angled outer wall 401 of the top liner 140, facing the combined gas exhaust volume 215, directs processing gas 320 flowing through the first inlet 225 away from the second inlet 220 to prevent the processing gas 320 from undesirably entering the second volume 110.

The exhaust channel 152 is positioned such that a gas outlet of the first volume 109 (shown as first inlet 225 to the combined gas exhaust volume 215) extends below the first surface 120a of the substrate support 120, and the gas outlet of the second volume 110 (shown as second inlet 220 to the combined gas exhaust volume 215) extends above the second surface 120b of the substrate support 120. Positioning the exhaust channel 152 in such a configuration can enable the pull of the vacuum in the exhaust channel 152 in fluid communication with the processing volume 103 to cause processing gas 320 from above the substrate support 120 and purge gas 310 from below the substrate support 120 to simultaneously enter the combined gas exhaust volume 215 without crossing between the respective first and second volumes 109 and 110. Further, by drawing the processing gas 320 down over the circumferential edge of the first surface 120a of the substrate support 120 through the restrictive first inlet 225, the residence time of the processing gas 320 in the first volume 109 is reduced when compared to conventional processing chambers. The width of an opening 240 is defined by the extension of the nose 403 formed at the outward terminus of the angled outer wall 401 from the inner wall 405 of the top liner 140.

Figure 4:
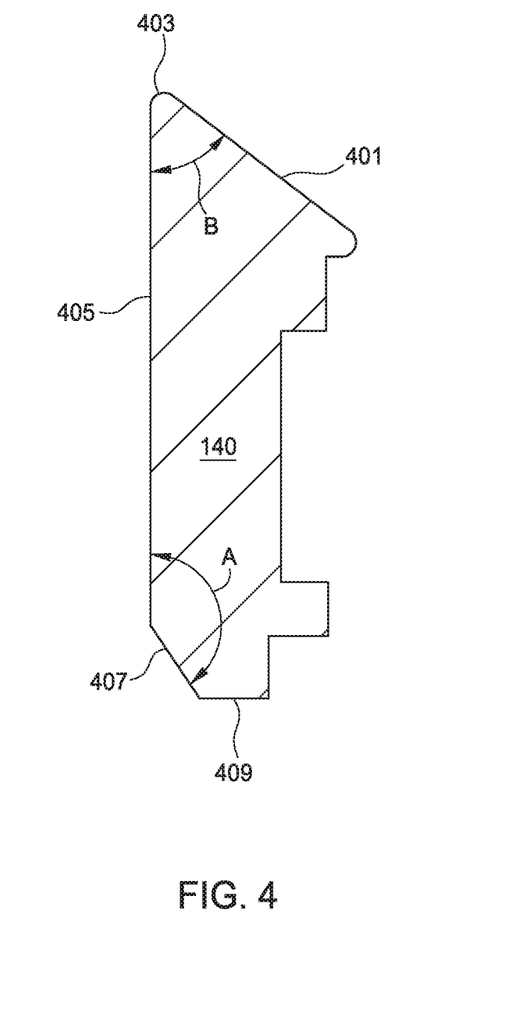
FIG. 4 is a partial sectional view of the top liner shown in FIGS. 1-3, according to one embodiment.

FIG. 4 illustrates a sectional shape of the top liner 140 shown in FIGS. 1A, 1B, 2, and 3, according to one embodiment. The top liner 140 includes at least an inner wall 405, an angled outer wall 401 connected to the inner wall 405 by a rounded nose 403 of the top liner 140, and a conical wall 407 connecting a second end 409 of the top liner 140 to the inner wall 405. When disposed in the processing chamber 100, the inner wall 405 is substantially parallel to the third surface 120c of the substrate support 120 about the outer circumference thereof. The angled outer wall 401 and the inner wall 405 form an angle B of less than about 80°, such as less than about 70°, such as less than about 60°, such as between about 30° and about 80°, or such as between about 45° and about 60°. The conical wall 407 connected to the inner wall 405 extends radially outwardly from the conical wall 407 towards the second end 409. Typically, the second end 409 of the top liner 140 rests on a surface of the bottom liner 165 when the top liner 140 is disposed in the processing chamber 100. The inner wall 405 and the conical wall 407 form an angle A of between about 120° and about 160°. An inner diameter of the conical wall 407 proximate to the second end 409 is about the same as the inner diameter $D_2$ of the bottom liner 165, shown in FIG. 1A. During substrate processing the conical wall 407 directs purge gas introduced through the one or more openings 119 in the chamber base towards the second inlet 220 to the combined gas exhaust volume 215. The width of opening 240 is defined by the extension of the nose 403 formed at the outward terminus of the angled outer wall 401 from the inner wall 405 of the top liner 140.

Figure 5:
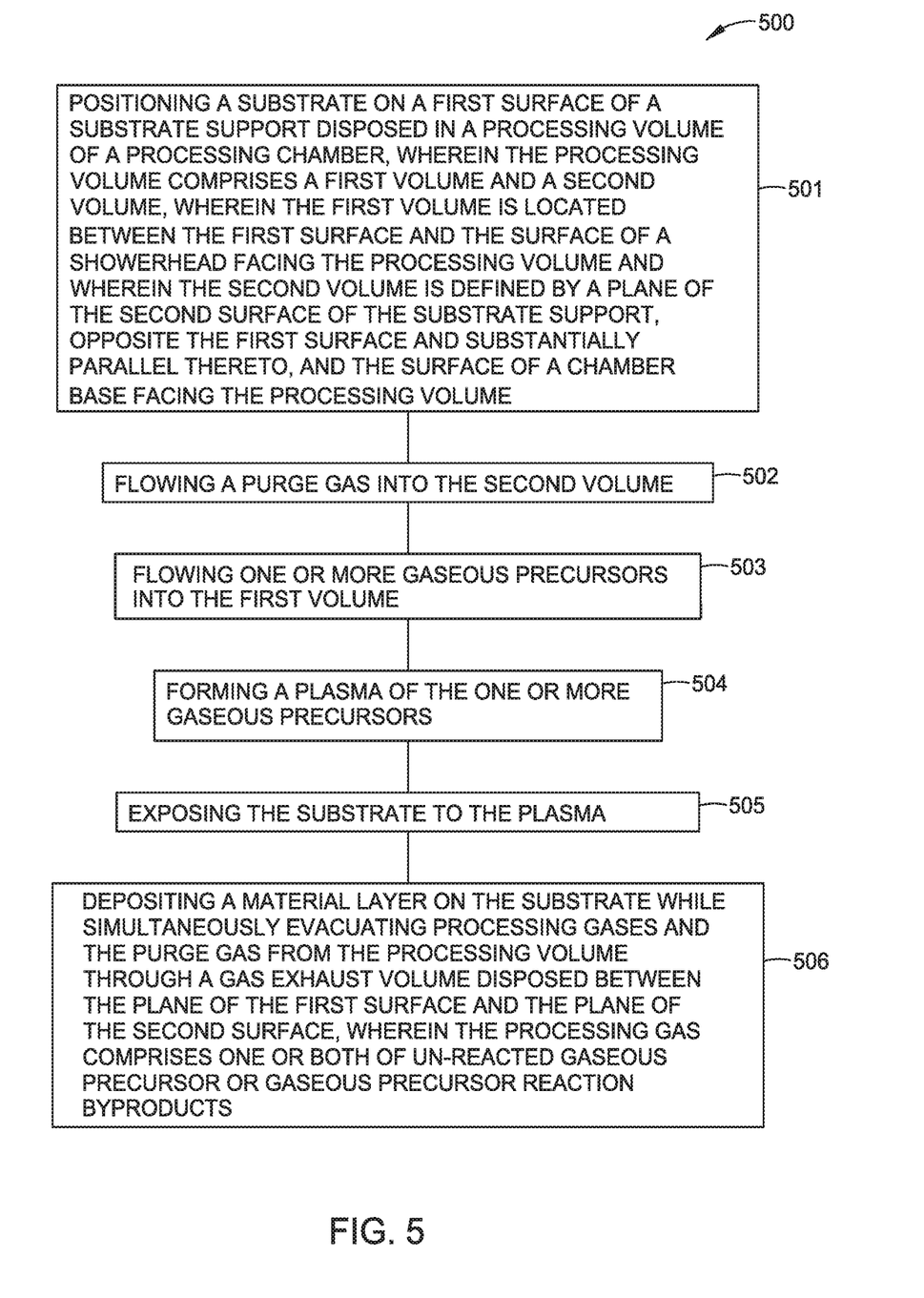
FIG. 5 is a flow diagram of a method of processing a substrate, according to one embodiment.

FIG. 5 is a flow diagram of a method of processing a substrate, according to one embodiment. At activity 501 the method 500 includes positioning the substrate on the first surface of a substrate support disposed in a processing volume of a processing chamber. The processing volume comprises a first volume and a second volume. The first volume is defined by the inner surface of the side walls of the chamber, a plane of the first surface, and the surface of a showerhead facing the first surface and the first volume of the processing volume. The second volume is defined by the inner surface of the side walls of the chamber, a plane of the second surface of the substrate support, opposite the first surface and oriented substantially parallel thereto, and the surface of a chamber base facing the second surface and the second volume of the processing volume.

At activity 502 the method 500 includes flowing a purge gas into the second volume. The purge gas comprises one or both of an inert gas, such as $N_2$, Ar, Ne, Kr, or a combination thereof, and an oxygen containing gas, such as $O_2$, $N_2O$, $CO_2$, or a combination thereof. The purge gas is selected, in part, based on a breakdown voltage thereof (the minimum voltage necessary to ignite a plasma formed of the purge gas between two electrodes as a function of gas pressure, voltage drop between the electrodes, such as between an RF biased substrate support and grounded chamber sidewalls, and the gap width). In some embodiments, the purge gas comprises $O_2$ which can be resistant to forming a plasma in the gaps forming the exhaust channel 152 and the outlet 230 through capacitive coupling with an RF bias voltage provided to the substrate support under. In some embodiments, purge gas that comprises $O_2$ can be desirably resistant to causing arcing from the substrate support through the liners adjacent thereto under the processing conditions and chamber configurations described herein.

At activities 503, 504, and 505, the method 500 includes respectively flowing one or more gaseous precursors into the first volume; forming a plasma of the one or more gaseous precursors; exposing the substrate to the plasma; and depositing a material layer on the substrate. Activity 505 of the method 500 further includes simultaneously (with depositing the material layer) evacuating a processing gas comprising one or both of unreacted gaseous precursor or gaseous precursor reaction byproducts and the purge gas from the processing volume through a gas exhaust volume at least partially disposed between the plane of the first surface and the plane of the second surface.

In some embodiments, the plasma is formed by capacitive coupling with the one or more gaseous precursors, where a power provided to the showerhead disposed in the chamber lid, or to a faceplate of the showerhead, is between about 100 W and about 3000 W. In some embodiments, the processing chamber comprises an inductive plasma generator and the plasma is formed through inductive coupling with the one or more gaseous precursors. In some embodiments, a showerhead adjacent the processing volume may be heated to an elevated temperature in one or more of activities 501-506.

In some embodiments, the one or more gaseous precursors comprise a silicon-containing precursor, such as silane, dimethylsilane, trimethylsilane, tetramethylsilane, diethylsilane, tetramethylorthosilicate (TMOS), tetraethylorthosilicate (TEOS), octamethyltetrasiloxane (OMTS), octamethylcyclotetrasiloxane (OMCTS), tetramethylcyclotetrasiloxane (TOMCATS), or a mixture thereof. In some embodiments, the one or more gaseous precursors comprise a mixture of a silicon-containing precursor and an oxygen-containing precursor, such as oxygen ($O_2$), ozone ($O_3$), NO, $NO_2$, or a mixture thereof, and/or a hydroxyl-containing precursor such as $H_2O$, hydrogen peroxide, or mixtures thereof. In some embodiments, the one or more gaseous precursors are combined with a carrier gas such as He, $N_2$, Ar or a combination thereof before flowing into the processing volume.

In some embodiments, the deposited material layer comprises silicon oxide, the gaseous precursor comprises TEOS, and a purge gas introduced into the second volume through one or more openings in the chamber base comprises $O_2$. Typically, the TEOS precursor flowrate is between about 5 grams per minute (gm/min) and about 30 gm/min, such as about 5 gm/min and about 25 gm/min. The processing volume is typically maintained at a pressure between about 10 mTorr and about 20 Torr, such as between about 1 Torr and about 10 Torr. The substrate is maintained at a temperature between about 350° C. and about 550° C., such as between about 400° C. and about 500° C., for example about 425° C. The temperature of a face plate of the showerhead is maintained between about 100° C. and about 300° C. An Ar carrier gas flowrate is between about 1 slm and about 20 slm, such as between about 5 slm and about 15 slm. The $O_2$ purge gas flowrate is between about 1 slm and about 20 slm, such as between about 1 slm and about 10 slm, such as about 5 slm. A spacing between the first surface of the substrate support and the showerhead is between about 150 mil and about 300 mil, such as about 200 mil and about 250 mil. The above values are for a processing chamber sized to process a 300 mm substrate, appropriate scaling may be used for processing chambers sized for other substrates.

Embodiments herein enable the flow of purge gas into the processing region below a substrate support while simultaneously depositing a thin film layer on a substrate disposed in a processing region above the substrate support and evacuating processing gases therefrom. By positioning a combined gas exhaust volume radially outward from the substrate support, locating the inlets to the combined gas volume between planes of the upper and lower surfaces of the substrate support, and extending the inlets above and below the respective upper and lower surfaces of the substrate support, processing gases and purge gas may be simultaneously evacuated from the respective upper and lower regions of the processing volume without crossing therebetween.

For example, the effect of reducing or eliminating transit of the gas flowing from below the substrate support 120 into the first volume 109, and transit of the gas flowing from above the support into the second volume 110, is influenced by several aspects. First, the effect is influenced by configuring the second inlet 220 to extend from the second surface 120*b* of the substrate support 120 at the circumferential perimeter thereof below the location of combined gas exhaust volume 215, along the outer wall of the support and the third surface 120*c*, and then into the combined gas exhaust volume 215. Second, the effect is influenced by configuring the first inlet 225 to extend from the location of the first surface 120*a* of the substrate support 120 at the circumferential perimeter thereof above the location of combined gas exhaust volume 215, along the third surface 120*c* of the substrate support 120, and then into the combined gas exhaust volume 215. This effect is maintained even where the upper and lower surfaces (first and second surfaces 120*a*, 120*b*) are not planar, so long as at least one of (or preferably both of) the outer perimeter of the lower surface (second surface 120*b*) is maintained below the opening of the second inlet 220 to the combined gas exhaust volume 215, and the outer perimeter of the upper surface (first surface 120*a*) is maintained above the opening of the first inlet into the combined gas exhaust volume 215.

Figure 6:
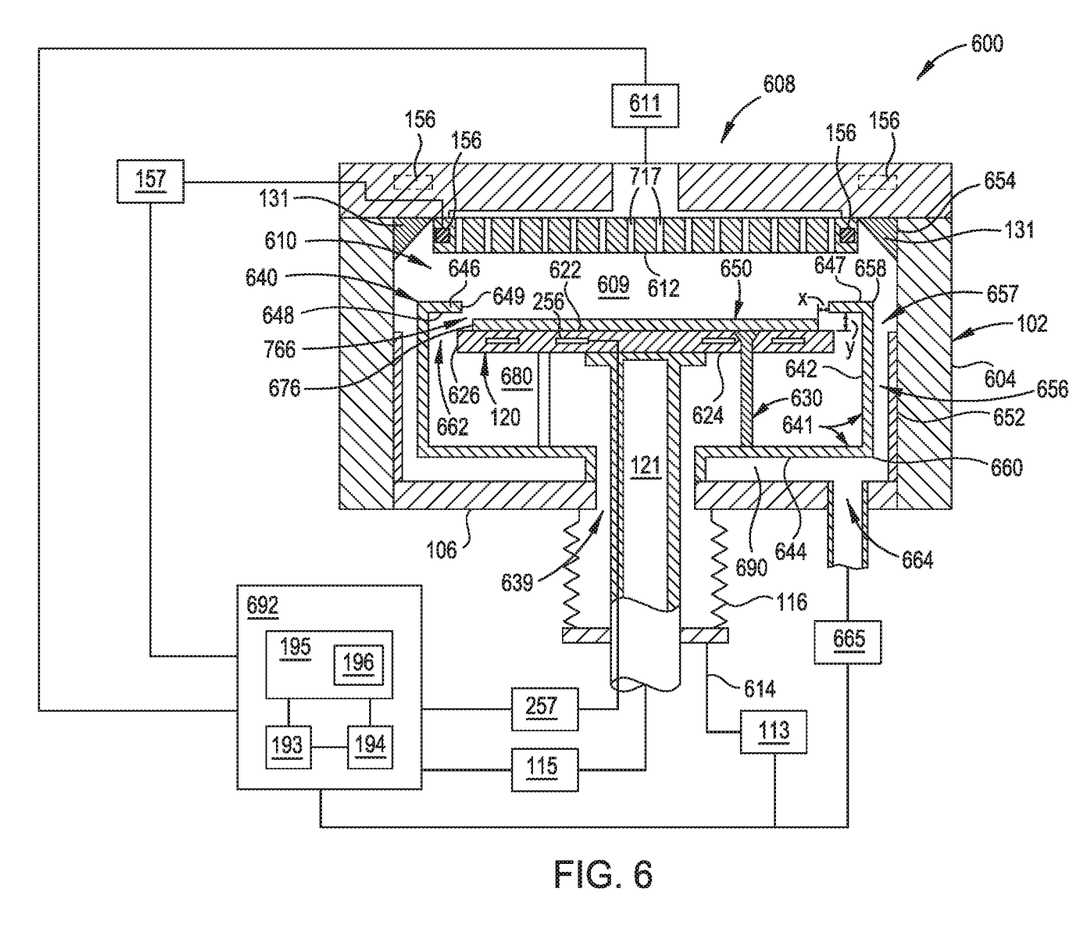
FIG. 6 is a schematic sectional view of a processing chamber system, according to one embodiment.

FIG. 6 illustrates a side sectional view of a processing chamber 600 with a cover substrate 650 in a non-spaced position, according to one embodiment of the disclosure. The cover substrate 650 may be used, for example, in a cleaning process. In some embodiments, the cover substrate 650 comprises a halogen resistant material. The processing chamber 600 includes a chamber body 102 having a chamber side wall 604, a chamber base 106, and a chamber lid assembly 608 disposed on the chamber side wall 604. The chamber side wall 604, chamber base 106, and chamber lid assembly 608 define an interior volume 610 of the processing chamber 600. The chamber side wall 604 may have an annular shape or include multiple walls to form a rectangular or square shape. The processing chamber 600 includes a showerhead 612 with a plurality of openings 717 and a substrate support 120. The showerhead 612 is similar to the showerhead 112 illustrated in FIG. 1B. The present disclosure contemplates that one or more of the features of showerhead 112 may be incorporated into showerhead 612. The showerhead 612 includes one or more heaters 156 that are similar to the heaters 156 illustrated in FIG. 1B. The process chamber 600 also includes a ring 131 disposed adjacent to the showerhead 612 and the chamber side wall 604. The ring 131 illustrated in FIG. 6 is similar to the ring 131 illustrated in FIG. 1B. The ring 131 may be extended radially inward to contact the showerhead 612, or may overlap with a lower surface thereof. In some examples, there is none-to-minimal space between a radially outward edge of the showerhead 612 and a radially inward surface of the ring 131. In other examples, the ring 131 is spaced from a lateral side of the showerhead 612. The substrate support 120 includes one or more heaters 156 that are similar to the one or more heaters 156 illustrated in FIG. 1B.

The region between the cover substrate 650 when the substrate support 120 is in a raised position shown in FIG. 6) and the showerhead 612 defines the process volume 609. The showerhead 612 supplies cleaning fluid from a cleaning fluid supply 611 to the process volume 609 through the showerhead 112. The cleaning fluid supply 611 may be a remote plasma source. In some embodiments, the process chamber 100 may include a plasma source (e.g., a capacitively coupled plasma chamber with a RF-hot fluid distribution plate). In some embodiments, the cleaning fluid may comprise fluorine-containing reactive gases.

The substrate support 120 is disposed in the interior volume 610. The substrate support 120 may be formed of a ceramic material, such as aluminum nitride. The substrate support 120 may include an electrostatic chuck, a ceramic body, a heater, a vacuum chuck, a susceptor, or a combination thereof. The substrate support 120 has a top support surface 622 that receives and supports a substrate (not shown in FIG. 6) during a manufacturing process of the substrate. During processing, such as a deposition process, the substrate would replace the cover substrate 650, shown in FIG. 6, on the top support surface 622. The substrate support 120 further includes a bottom support surface 624, and a side support surface 626 disposed between the bottom support surface 624 and the top support surface 622.

In FIG. 6, the cover substrate 650 is shown in a non-spaced position relative to the substrate support 120. When in the non-spaced position, the cover substrate 650 is in physical contact with the top support surface 622 of the substrate support 120. In some embodiments, the substrate support 120 may be raised to the raised position 617 with the cover substrate 650 in physical contact with the top support surface 122.

A lift actuator 115 is configured to move the substrate support 120 between the raised position, as shown in FIG. 6, and a lowered position (not shown). The lift pins 630 are configured to move relative to the substrate support 120. The lift pins 630 may raise or lower the cover substrate 650. Movement of the substrate support 120 or the lift pins 630 may place cover substrate 650 in a spaced position (not shown). In the spaced position, the cover substrate 650 is vertically separated from the top support surface 122 of the substrate support 120.

The substrate support 120 may be placed in the raised position during the manufacturing process for the substrate (not shown). In the lowered position (not shown), a robot or other transfer mechanism (not shown) may be used to place the cover substrate 650 in the processing chamber 600. The lift pins 630 extend through the substrate support 120. A slit valve (not shown) may extend through the chamber side wall 604 of chamber body 102 to provide an opening to transfer the cover substrate 650 into or out of the interior volume 610.

A purge gas may be supplied to the processing chamber 600 during a cleaning process of the processing chamber 600. The purge gas may be supplied from a purge gas source 113 through a purge gas line 614. In some embodiments, the purge gas line 614 may be coupled to the processing chamber 600 through the bellows 116 in order to maintain a positive pressure in the bellows 116 during movement of the substrate support 120 by the lift actuator 115. The purge gas is supplied through a purge gas opening 639 formed between the chamber base 106 and the support shaft 121. The purge gas is supplied to a purge volume 680 in the processing chamber 600.

The processing chamber 600 further includes a process kit 640 that protects the chamber body 102 from processing fluids and provides flow paths for the processing fluids. The process kit 640 includes a pumping liner 641 and a top edge member 646. The pumping liner 641 surrounds the purge volume 680. The pumping liner 641 includes a side pumping liner 642 and the bottom pumping plate 644. In some embodiments, the process kit 640 includes an outer pumping liner 652. The outer pumping liner 652 is disposed adjacent an interior chamber surface 654 of the chamber side wall 604. The side pumping liner 642 is spaced radially inward from the chamber side wall 604 to define an outer flow path 656.

The side pumping liner 642 extends from a top end 658 to a bottom end 660. The side pumping liner 642 is laterally spaced from the side support surface 626 of the substrate support 120 to form a substrate support outer opening 662. The side pumping liner 642 of the pumping liner 641 is disposed outwardly from the substrate support 120. The top end 658 of the side pumping liner 642 is disposed above the top support surface 622. The bottom end 660 is spaced from the chamber base 106 and is coupled to the bottom pumping plate 644. A bottom section 690 of the outer flow path 656 is defined by the bottom pumping plate 644 and the chamber base 106. The bottom pumping plate 644 extends from the bottom end 660 of the side pumping liner 642 to a position adjacent the purge gas opening 639. An exhaust outlet 664 extends through the chamber base 106, and is in fluid communication with the outer flow path 656. The exhaust outlet 664 is coupled to a vacuum pump 665.

The top edge member 646 of the process kit 640 is coupled to the side pumping liner 642. The top edge member 646 includes a top surface 647, a bottom surface 648, and a side surface 649. The top edge member 646 extends over and is vertically spaced from the top support surface 622 of the substrate support 120. At least a portion of the top edge member 646, including the side surface 649, extends over the top support surface 622 of the substrate support 120. At least a portion of the top edge member 646 is disposed outwardly from the substrate support 120. A purge gap 766 is disposed between the top edge member 646 and the cover substrate 650. The top edge member 646 has a side surface 649 that extends over the top support surface 622. In some embodiments, the side surface 649 is laterally spaced from the cover substrate 650 on the top support surface 622 so as to not extend over the cover substrate 650. In some embodiments, the side surface 649 is laterally spaced from a cover substrate outer surface 676 by a lateral distance X that is within a range of about 1 mm to about 3 mm. In some embodiments, the bottom surface 648 is vertically spaced from the top support surface 622 by a vertical distance Y that is within a range of about 1 mm to about 8 mm.

In some embodiments, the cover substrate 650 is in a spaced position where a cover substrate outer surface 676 opposes the side surface 649 to define the purge gap 766. In some embodiments, the cover substrate 650 is in a spaced position such that the purge volume 680 comprises a top purge volume (now shown) disposed between the substrate support 120 and the cover substrate 650 and a bottom purge volume (not shown) disposed below the substrate support 120. In some embodiments, the cover substrate 650 is in a spaced position such that the top edge member 646 forms a ring around the cover substrate 650 and is planar with the cover substrate 650 to form a top purge barrier separating the top purge volume from the process volume 609. In some embodiments, the purge gap 766 extends through the top purge barrier.

The top purge barrier is formed in the interior volume 610 of the chamber body 102 above the substrate support 120. The top purge barrier is formed by the cover substrate 650 and the top edge member 646. The top purge barrier separates the process volume 609 disposed above the top purge barrier and a purge volume 680 disposed below the top purge barrier. The pumping liner 641 separates the purge volume 680 from the outer flow path 656 disposed between the chamber body 102 and the pumping liner 641. The purge gap 766 extends through the top purge barrier. The pumping liner 641 further includes a top opening 657 extending from the process volume 609 into the outer flow path 656 to provide fluid communication between the process volume 609 and the outer flow path 656.

The processing chamber 600 illustrated in FIG. 6 also includes a controller 692 that is similar to the controller 192 illustrated in FIG. 1B. The present disclosure contemplates that one or more of the features of controller 192 may be incorporated into controller 692. The controller 692 illustrated in FIG. 6 is configured to control at least the purge gas source 113, lift actuator 115, one or more power sources 157, one or more power sources 257, cleaning fluid supply 611, and vacuum pump 665.

The process kit 640 is configured to control the flow profile through the processing chamber 600 such that the process kit 640 may protect the substrate support 120 from the cleaning fluid and potential contaminants resulting from the cleaning fluid. A purge gas can be used together with the process kit 640 to generate a purge gas curtain that can block the cleaning fluid from contacting the substrate support 120 during the cleaning process. The purge gas curtain prevents the cleaning fluid from reaching the substrate support 120 and reacting with the substrate support material and forming contaminants in the processing chamber 600. In some embodiments, during an initial purging process the purge gas is pumped into purge volume 680 prior to the cleaning fluid being pumped into the process volume 609. In some embodiments, the purge gas is pumped prior to the cleaning fluid being pumped such that the purge gas forms a fluid curtain around the substrate support 120.

Purge gas may flow through the purge gas opening 639, into the purge volume 680, and into the process volume 609 through the purge gap 766. The purge gas may then flow to the outer flow path 656 and through the exhaust outlet 664. The vacuum pump 665 may be used to pump the purge gas through the outer flow path 656 to the exhaust outlet 664. In some embodiments, the purge volume 680 is maintained at a positive pressure with respect to the process volume 609 so that purge gas flows from the purge volume 680 to the process volume 609. The positive pressure is maintained in the purge volume 680 so that purge gas flows through the purge gap 766 to block cleaning fluid from flowing from the process volume 609 through the top purge barrier and into the purge volume 680. The pressure in the purge volume 680 is greater than the pressure in the process volume 609 during the cleaning process. In some embodiments, the purge gap 766 is selected such that the purge volume 680 maintains a positive pressure relative to the process volume 609 during a cleaning process. In some embodiments, the process volume 609 and the purge volume 680 are maintained at a vacuum relative to the ambient pressure external of the processing chamber 600.

While flowing the purge gas through the purge volume 680 and to the process volume 609, the cleaning process can start. The flowing of the cleaning fluid to the process volume 609, in some embodiments, includes starting to flow the cleaning fluid through the showerhead 612 from the cleaning fluid supply 611 while the process volume 609 contains purge gas from the initial purging process. In the cleaning process, the cleaning fluid flows into the process volume 609 by flowing cleaning fluid through the showerhead 612. In some embodiments, the cleaning fluid is supplied by the cleaning fluid supply 611, which in some embodiments is a remote plasma source. The cleaning fluid from the process volume 609 and purge gas that flows into the process volume 609 from the purge volume 680 flows to the outer flow path 656 and out the exhaust outlet 664. The pumping liner 641 separates the purge volume 680 disposed below the cover substrate 650 and the top edge member 646 from the outer flow path 656 disposed between the chamber body 102 and the pumping liner 641. In some embodiments, the flowing of purge gas and the flowing of cleaning fluid occur simultaneously for at least part of the cleaning process.

The cleaning fluid flows out of the processing chamber 600 through the exhaust outlet 664. The cover substrate 650 and the top edge member 646 form the top purge barrier that blocks the cleaning fluid from the purge volume 680 and the substrate support 120 disposed in the purge volume 680. Purge volume 680 is maintained at a positive pressure with respect to the process volume 609. The positive pressure can have the benefit of stopping or reducing the contact of the cleaning fluid with the substrate support 120 during the cleaning process. Stopping or reducing the contact of the cleaning fluid with the substrate support 120 during the cleaning process may prevent or reduce the formation of contaminants in the processing chamber 600 due to cleaning fluid reaction with aluminum nitride or other materials of the substrate support 120 during the cleaning process.

In some embodiments, after the cleaning process a post cleaning process starts. During the post cleaning phase, the flow of cleaning fluid through the showerhead 612 stops and the purge gas continues to be supplied to the processing chamber 600. A positive pressure may be maintained in the purge volume 680 relative to the processing volume 609 such that purge gas blocks cleaning fluid from the purge volume 680. The purge gas continues to be supplied to the purge volume 680 of the process chamber 600 for a selected time period after stopping the flow of process gas to the process volume 609 during the cleaning process. The selected time period is an amount of time selected to remove cleaning fluid from the process volume 609 supplied during the cleaning process.

After the cleaning process and the post cleaning process, the cover substrate 650 may be removed from the process volume 609. The processing chamber 600 is then ready for a substrate to be transferred into the processing chamber 600 by transferring the substrate through the slit valve (not shown) and above the substrate support 120. The substrate may be placed on the lift pins 630 or in physical contact with the top support surface 622 by a transfer mechanism (not shown) in a conventional manner. A deposition process may then be performed on the substrate by flowing process gas through the showerhead 612 to deposit one or more layers on the substrate. The process gas flows through the outer flow path 656 to the exhaust outlet 664. After a number of substrates have been processed in the processing chamber 600, a cleaning process as described above may be performed.

Benefits of the disclosure include reduced deposition of films and residues on walls and components of a substrate processing chamber, and reduced deposition of cleaning contaminants on walls and components of a substrate processing chamber. Such benefits can result in fewer cleaning cycles, greater time between scheduled maintenance procedures, and an overall increase in the production capacity of the processing chamber.

While the foregoing is directed to embodiments of the present disclosure, other and further embodiments of the disclosure may be devised without departing from the basic scope thereof, and the scope thereof is determined by the claims that follow.

The invention claimed is:
1. A processing chamber system, comprising:
a chamber body having a chamber base, one or more sidewalls, and a chamber lid defining a processing volume,
wherein the chamber lid comprises a showerhead;
a substrate support disposed in the processing volume, the substrate support having a first surface, a second surface opposite the first surface, and a third surface connecting the first surface and the second surface around a circumference of the substrate support;

wherein the processing volume comprises:
  a first volume defined by the first surface of the substrate support and a surface of the showerhead that faces the processing volume, and
  a second volume defined by the second surface of the substrate support and a surface of the chamber base that faces the processing volume;
a purge gas inlet that is configured to introduce a purge gas into the second volume through one or more openings;
a precursor inlet that is configured to introduce a precursor gas into the first volume through the showerhead;
a combined gas exhaust volume that is configured to evacuate the purge gas and the precursor gas, wherein the precursor gas is evacuated from the first volume to the combined gas exhaust volume through a first gas inlet and the purge gas is evacuated from the second volume to the combined gas exhaust volume through a second gas inlet; and
one or more heaters disposed in the showerhead that are configured to heat the showerhead.

2. The processing chamber system of claim 1, further comprising a controller being configured to, when executed by a processor:
  cause the one or more heaters disposed in the showerhead to heat the showerhead;
  introduce the precursor gas into the first volume;
  introduce the purge gas into the second volume; and
  evacuate the precursor gas from the first volume while simultaneously evacuating the purge gas from the second volume.

3. The processing chamber system of claim 2, wherein the controller is configured to, when executed by the processor, cause the one or more heaters disposed in the showerhead to heat the showerhead to a temperature within a range of about 270 degrees Celsius to about 350 degrees Celsius.

4. The processing chamber system of claim 1, further comprising a ring disposed on a faceplate of the showerhead, wherein the ring is disposed radially outside of one or more openings in the faceplate of the showerhead.

5. The processing chamber system of claim 4, wherein the ring comprises an angled inner surface.

6. The processing chamber system of claim 1, wherein the combined gas exhaust volume is disposed between a plane of the first surface and the chamber base.

7. A processing chamber system, comprising:
  a chamber body having a chamber base, one or more sidewalls, and a chamber lid defining a processing volume,
  wherein the chamber lid comprises a showerhead;
  a substrate support disposed in the processing volume, the substrate support having a first surface, a second surface opposite the first surface, and a third surface connecting the first surface and the second surface around a circumference of the substrate support;
  a first liner disposed in a circumferential channel in the chamber body,
  wherein the first liner is located between a plane of the second surface and the chamber base;
  a second liner disposed radially inwardly of the first liner, wherein the first liner and the second liner define an exhaust channel;
  a third liner disposed radially inwardly of the one or more sidewalls between the first liner and the chamber lid, wherein the second liner, the third liner, and the third surface of the substrate support define a combined gas exhaust volume when the substrate support is in a raised position,
  wherein a first inlet to the combined gas exhaust volume is disposed between the substrate support and the third liner and a second inlet to the combined gas exhaust volume is disposed between the substrate support and the second liner when the substrate support is in the raised position, and
  wherein an opening into the combined gas exhaust volume from the first inlet is below the plane of the first surface and an opening into the combined gas exhaust volume form the second inlet is above the plane of the second surface when the substrate support is in the raised position; and
  one or more heaters disposed in the showerhead that are configured to heat the showerhead.

8. The processing chamber system of claim 7, wherein a width of the first inlet is between about 0.5 mm and about 10 mm.

9. The processing chamber system of claim 8, wherein a width of the second inlet is between about 1 mm and about 3 mm.

10. The processing chamber system of claim 7, further comprising a controller being configured to, when executed by a processor:
  cause the one or more heaters disposed in the showerhead to heat the showerhead.

11. A processing chamber system, comprising:
  a chamber body having an interior volume, wherein the chamber body has an interior chamber surface;
  a substrate support disposed in the interior volume;
  a showerhead having one or more heaters that are configured to heat the showerhead;
  a process kit disposed in the interior volume, the process kit comprising:
    a top edge member disposed outwardly from the substrate support,
    a pumping liner disposed outwardly from the substrate support in the chamber body, wherein the pumping liner surrounds a purge volume, and
    an outer flow path disposed between the pumping liner and the interior chamber surface;
  a purge gas opening in the chamber body in fluid communication with the purge volume;
  an exhaust outlet in the chamber body, wherein the exhaust outlet is in fluid communication with the outer flow path; and
  a cover substrate disposed above the substrate support, wherein a purge gap is disposed between the top edge member and the cover substrate.

12. The processing chamber system of claim 11, further comprising a ring disposed on a faceplate of the showerhead, wherein the ring is disposed radially outside of one or more openings in the faceplate of the showerhead.

13. The processing chamber system of claim 12, wherein the ring comprises an angled inner surface.

14. The processing chamber system of claim 11, wherein the top edge member has a side surface, wherein the cover substrate has a cover substrate outer surface, and wherein the side surface is laterally spaced from the cover substrate outer surface by a lateral distance to define a purge gap, and wherein the lateral distance is within a range of about 1 mm to about 3 mm.

15. The processing chamber system of claim 11, wherein the pumping liner separates the purge volume from the outer flow path.

16. The processing chamber system of claim 11, wherein the substrate support has a top support surface, wherein the top edge member extends over and is vertically spaced from the top support surface by a vertical distance that is within a range of about 1 mm to about 8 mm.

17. The processing chamber system of claim 11, further comprising a controller being configured to, when executed by a processor:
cause the one or more heaters to heat the showerhead; and
introduce a purge gas into the purge volume through the purge gas opening.

18. The processing chamber system of claim 17, wherein the controller is configured to, when executed by the processor, cause the one or more heaters to heat the showerhead to a temperature within a range of about 270 degrees Celsius to about 350 degrees Celsius.

19. The processing chamber system of claim 17, further comprising a cleaning fluid inlet that is configured to introduce a cleaning fluid into a process volume.

20. The processing chamber system of claim 19, wherein the controller is further configured to, when executed by the processor, maintain the purge volume at a positive pressure relative to the process volume.

21. The processing chamber system of claim 1, further comprising a pumping liner disposed at least partially in the second volume, wherein the pumping liner surrounds at least part of the second volume.

22. The processing chamber system of claim 11, wherein the exhaust outlet comprises one or more exhaust ports formed through one or more sidewalls of the chamber body.

* * * * *